US010529531B2

(12) United States Patent
Oshima et al.

(10) Patent No.: US 10,529,531 B2
(45) Date of Patent: Jan. 7, 2020

(54) ION SOURCE AND ELECTRON SOURCE HAVING SINGLE-ATOM TERMINATION STRUCTURE, TIP HAVING SINGLE-ATOM TERMINATION STRUCTURE, GAS FIELD ION SOURCE, FOCUSED ION BEAM APPARATUS, ELECTRON SOURCE, ELECTRON MICROSCOPE, MASK REPAIR APPARATUS, AND METHOD OF MANUFACTURING TIP HAVING SINGLE-ATOM TERMINATION STRUCTURE

(71) Applicant: HITACHI HIGH-TECH SCIENCE CORPORATION, Tokyo (JP)

(72) Inventors: Chuhei Oshima, Gunma (JP); Masahiko Tomitori, Ishikawa (JP); Anto Yasaka, Tokyo (JP); Tatsuya Shimoda, Nagano (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/203,078

(22) Filed: Nov. 28, 2018

(65) Prior Publication Data

US 2019/0164719 A1    May 30, 2019

(51) Int. Cl.
| | | |
|---|---|---|
| *H01J 37/00* | (2006.01) | |
| *H01J 37/08* | (2006.01) | |
| *H01J 37/28* | (2006.01) | |
| *H01J 37/305* | (2006.01) | |
| *H01J 37/30* | (2006.01) | |
| *H01J 37/21* | (2006.01) | |
| *H01J 37/252* | (2006.01) | |

(52) U.S. Cl.
CPC ............. *H01J 37/08* (2013.01); *H01J 37/21* (2013.01); *H01J 37/28* (2013.01); *H01J 37/3002* (2013.01); *H01J 37/3053* (2013.01); *H01J 37/252* (2013.01); *H01J 2237/0807* (2013.01); *H01J 2237/2623* (2013.01)

(58) Field of Classification Search
CPC ........ H01J 37/08; H01J 37/21; H01J 37/3053; H01J 37/28; H01J 37/3002; H01J 2237/0807; H01J 37/252; H01J 2237/2623
USPC .................................. 250/423 R, 424, 423 F
See application file for complete search history.

(56) References Cited

U.S. PATENT DOCUMENTS

2009/0110951 A1* 4/2009 Kuo ....................... B82Y 35/00
                                                                428/600

FOREIGN PATENT DOCUMENTS

| JP | 2006189276 | 1/2005 |
|---|---|---|
| JP | 2009517838 | 4/2009 |
| JP | 2015057764 | 3/2015 |

* cited by examiner

*Primary Examiner* — Michael Maskell
(74) *Attorney, Agent, or Firm* — Holland & Hart LLP

(57) ABSTRACT

Provided is a tip capable of repeatedly regenerating a single-atom termination structure in which a distal end is formed of only one atom. A tip (1) having a single-atom termination structure includes: a thin line member (2) made of a first metal material; a protruding portion (4) made of a second metal material, which is formed at least in a distal end portion (2*a*) of the thin line member (2), and has a distal end terminated with only one atom; and a supply portion (5) made of the second metal material to be supplied to the protruding portion (4), which is formed in the vicinity of the distal end portion (2*a*) of the thin line member (2).

10 Claims, 7 Drawing Sheets

ION SOURCE AND ELECTRON SOURCE HAVING SINGLE-ATOM TERMINATION STRUCTURE, TIP HAVING SINGLE-ATOM TERMINATION STRUCTURE, GAS FIELD ION SOURCE, FOCUSED ION BEAM APPARATUS, ELECTRON SOURCE, ELECTRON MICROSCOPE, MASK REPAIR APPARATUS, AND METHOD OF MANUFACTURING TIP HAVING SINGLE-ATOM TERMINATION STRUCTURE

CROSS REFERENCE TO RELATED APPLICATION(S)

This application claims the benefit of Japanese Patent Application No. 2017-231148, filed Nov. 30, 2017, which is hereby incorporated by reference in its entirety into this application.

BACKGROUND OF THE INVENTION

1. Field of the Invention

The present invention relates to an ion source and an electron source having a single-atom termination structure, a tip having a single-atom termination structure, a gas field ion source, a focused ion beam apparatus, an electron source, an electron microscope, a mask repair apparatus, and a method of manufacturing a tip having a single-atom termination structure.

2. Description of the Related Art

A sharpened needle-like electrode configured to generate an electron or an ion in an electron source of an electron microscope or in a gas field ion source (GFIS) of a focused ion beam (FIB) apparatus is hereinafter referred to as "tip".

It has hitherto been desired that, in order to observe and render a high-resolution image in the electron microscope and the focused ion beam apparatus, a distal end of the tip be sharpened so as to be formed of about several atoms.

It has hitherto been known that, in a scanning ion microscope equipped with a gas field ion source using a single crystal tungsten tip, a distal end of the tungsten tip configured to emit ions is terminated with a trimer formed of three tungsten atoms (see, for example, Japanese Patent Translation Publication No. 2009-517838).

Further, there has hitherto been known a single crystal iridium tip having a pyramidal structure including a distal end of <210> orientation surrounded by one {100} crystal plane and two {111} crystal planes, the distal end being terminated with only one iridium atom (see, for example, Japanese Patent Application Laid-open No. 2015-057764).

Further, there has hitherto been known a method involving plating a surface, which is obtained by sharpening a tip distal end portion of tungsten or molybdenum by electropolishing, with gold, platinum, palladium, iridium, rhodium, or an alloy thereof, and subjecting the resultant to electropolishing or heating, to thereby terminate the tip distal end portion with a single atom (see, for example, Japanese Patent Application Laid-open No. 2006-189276).

(Regarding Tungsten Tip)

The tungsten tip to be used in a gas field ion source in the related art described above includes three atoms called a trimer as an apex and is configured to simultaneously emit three beams from those three atoms. An electron microscope or focused ion beam apparatus including the gas field ion source is configured to select one beam from those three beams emitted from the tungsten tip with a diaphragm set in an ion beam path and focus the beam to irradiate a sample with the focused beam. Therefore, a beam current reaching the sample is at least reduced to ⅓ of the entire beam current. Further, even when a total value of ion currents of all the three beams emitted from the distal end of the tip is constant, there is a risk in that the equilibrium of an ion current amount of the beam emitted from each of the three atoms may become unstable. A reduction in beam current causes problems in that image quality is degraded in imaging, and a processing amount is reduced in processing. Thus, in the tungsten tip terminated with three atoms, there is a risk in that a processing shape and an observation image become unstable.

Further, when the tungsten distal end is subjected to treatment, such as heating in a vacuum ion chamber, residual gas in the vacuum ion chamber, in particular, oxygen or nitrogen is liable to adhere to the surface of the tungsten tip, and reaction occurs when oxygen or nitrogen adheres to the surface of the tungsten tip, with the result that a tungsten oxide or nitride having a low field evaporation intensity is generated. There is a risk in that damages, which are caused by field evaporation of the oxide or nitride from the surface of the tungsten tip at a low field intensity, may worsen. A trace amount of oxygen or nitrogen is used for sharpening the tungsten tip. Therefore, the generation of the oxide or nitride on the surface of the tungsten tip is inevitable. When damages occur on the distal end of the tungsten tip, there is a risk in that the generated ion current may fluctuate, and further ion emission may stop. Further, when damages occur on the distal end of the tungsten tip, it is required to sharpen the distal end again, and there is a problem in that the downtime of an apparatus having the tungsten tip mounted thereon increases. In order to solve the above-mentioned problem, when a helium gas is introduced into the ion source chamber so as to cause helium ions to be emitted from the gas field ion source having the tungsten tip mounted thereon, there arises a problem in that expensive gas with high purity is required to cause an increase in cost.

(Regarding Iridium Tip)

The tungsten tip has a problem of the risk in that the sharpened distal end is liable to be formed of three atoms, and a reduction in beam current amount reaching a sample to be irradiated and a beam fluctuation may occur. In contrast, a distal end of the iridium tip can be terminated with a single atom. Further, the iridium tip has chemical resistance higher than that of the tungsten tip, and hence damages to the distal end caused by residual gas are suppressed. However, the iridium tip is liable to be plastically deformed. Therefore, when the iridium tip is bent beyond an optical axis adjustable range in an electron microscope or focused ion beam apparatus including a gas field ion source using the iridium tip, there arises a problem in that it becomes difficult to align a beam with an optical axis.

(Regarding Metal Tip Having Electroplated Distal End)

In the metal tip having an electroplated distal end in the related art described above, the tip distal end is merely plated with a small amount of noble metal while a region other than the tip distal end is masked. Therefore, when the distal end structure of the tip is repeatedly regenerated by heating treatment or the like, there is a risk in that the noble metal at the tip distal end may be exhausted. When it becomes difficult to regenerate the distal end structure of the tip, it is required to replace the tip, and there arises a problem in that the electron microscope or focused ion beam apparatus having the tip mounted thereon cannot be continuously operated for a long time period.

SUMMARY OF THE INVENTION

The present invention has been made in view of the above-mentioned circumstances. According to a first aspect of the present invention, there is provided a tip, which has a single-atom termination structure having a distal end formed of one atom and in which the single-atom termination structure can be repeatedly regenerated.

According to a second aspect of the present invention, there is provided a gas field ion source or electron source capable of continuously emitting an ion beam or electron beam for a long time period in a satisfactory current stability state through use of the tip having a single-atom termination structure.

According to a third aspect of the present invention, there is provided a focused ion beam apparatus or electron microscope, which has the gas field ion source or electron source mounted thereon, and exhibits performance with long operating life and high stability.

According to a fourth aspect of the present invention, there is provided a mask repair apparatus capable of performing high-precision processing for a long time period through use of the tip having a single-atom termination structure.

In order to solve the above-mentioned problems, the present invention employs the following embodiments.

(1) According to one embodiment of the present invention, there is provided a tip having a single-atom termination structure, including: a thin line member made of a first metal material; a protruding portion made of a second metal material, the protruding portion being formed at least in a distal end portion of the thin line member and having a distal end terminated with only one atom; and a supply portion made of the second metal material to be supplied to the protruding portion, the supply portion being formed in a vicinity of the distal end portion of the thin line member (2) In the tip having a single-atom termination structure described in the above-mentioned item (1), the thin line member may include a rod-like portion and a tapered portion contiguous to the rod-like portion, and the supply portion may be formed on the rod-like portion of the thin line member.

(3) In the tip having a single-atom termination structure described in the above-mentioned item (1) or (2), the first metal material may include at least anyone of tungsten, niobium, tantalum, and molybdenum, and the second metal material may include at least any one of iridium, platinum, osmium, and palladium.

(4) According to one embodiment of the present invention, there is provided a gas field ion source, including: the tip having a single-atom termination structure described in any one of the above-mentioned items (1) to (3) as an emitter configured to emit an ion beam; an ion source chamber configured to accommodate the emitter; a gas supply unit configured to supply gas to be ionized to the ion source chamber; an extraction electrode configured to ionize the gas to generate anion of the gas and apply a voltage for extracting the ion of the gas from the emitter; a power source configured to apply a positive voltage and a negative voltage to the tip having a single-atom termination structure; and a heating unit configured to heat the tip having a single-atom termination structure.

(5) According to one embodiment of the present invention, there is provided a focused ion beam apparatus, including: the gas field ion source described in the above-mentioned item (4); and a control unit configured to form a focused ion beam through use of the ion of the gas generated in the gas field ion source and irradiate a sample with the focused ion beam to perform at least any one of observation, processing, and analysis of an irradiation region of the sample.

(6) According to one embodiment of the present invention, there is provided an electron source, including: the tip having a single-atom termination structure described in any one of the above-mentioned items (1) to (3) as a tip configured to emit an electron; an extraction electrode configured to generate the electron and apply a voltage for extracting the electron from the tip; a power source configured to apply a negative voltage to the tip; and a heating unit configured to heat the tip.

(7) According to one embodiment of the present invention, there is provided an electron microscope, including: the electron source described in the above-mentioned item (6); and a control unit configured to form an electron beam through use of the electron generated in the electron source and irradiate a sample with the electron beam to perform at least any one of observation and measurement of a minute region of the sample, in which the electron microscope is at least any one of a scanning electron microscope, a transmission electron microscope, and a scanning transmission electron microscope.

(8) According to one embodiment of the present invention, there is provided a mask repair apparatus, including: the gas field ion source described in the above-mentioned item (4); and a control unit configured to form a focused ion beam through use of the ion of the gas generated in the gas field ion source and repair a defect portion of a photomask with the focused ion beam.

(9) According to one embodiment of the present invention, there is provided a method of manufacturing the tip having a single-atom termination structure described in any one of the above-mentioned items (1) to (3), the method including single-atom termination treatment of forming the distal end terminated with one atom of the second metal material by applying a negative voltage to the thin line member having the supply portion and heating the thin line member to diffuse the second metal material from the supply portion to the distal end portion of the thin line member.

(10) The method of manufacturing the tip having a single-atom termination structure described in the above-mentioned item (9) may further include: cleaning treatment of cleaning the distal end portion of the thin line member; heating treatment of heating the distal end portion of the thin line member; and supply portion forming treatment of forming the supply portion in the vicinity of the distal end portion of the thin line member, the cleaning treatment, the heating treatment, and the supply portion forming treatment being subsequently performed prior to the single-atom termination treatment.

According to the above-mentioned embodiments, the tip including the supply portion configured to supply a raw material to the protruding portion having the distal end terminated with only one atom can be provided. The supply portion can supply a raw material required for repeatedly regenerating the single-atom termination structure of the tip to the protruding portion and satisfactorily maintain the single-atom termination structure of the tip for a long time period.

Further, according to the above-mentioned embodiments, the gas field ion source or electron source capable of continuously emitting an electron beam or ion beam having satisfactory current stability for a long time period can be provided.

Further, with the gas field ion source or the electron source according to the above-mentioned embodiments, the focused ion beam apparatus or electron microscope which exhibits performance with long operating life and high stability can be provided.

Further, with the tip according to the above-mentioned embodiments, the mask repair apparatus capable of performing high-precision processing for a long time period can be provided.

DESCRIPTION OF THE EMBODIMENTS

Now, a tip having a single-atom termination structure, a gas field ion source, a focused ion beam apparatus, an electron source, an electron microscope, a mask repair apparatus, and a method of manufacturing a tip having a single-atom termination structure according to embodiments of the present invention are described with reference to the accompanying drawings.

(First Embodiment) Tip Having a Single-Atom Termination Structure

Figure 1A:
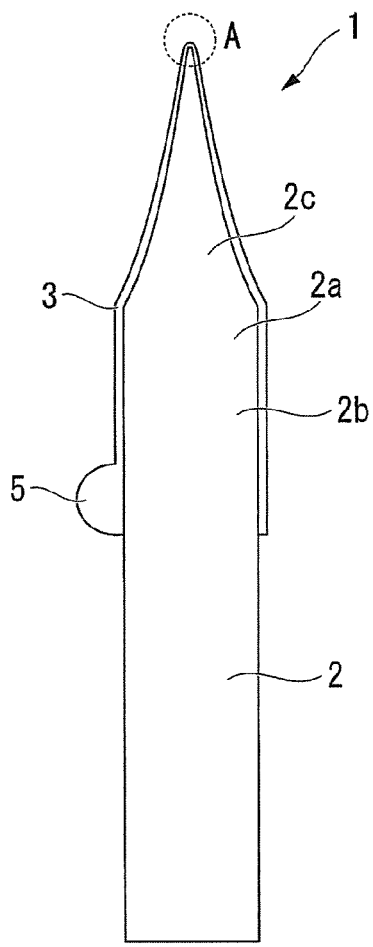
FIG. 1A is a schematic sectional view of a tip having a single-atom termination structure according to an embodiment of the present invention.
Figure 1B:
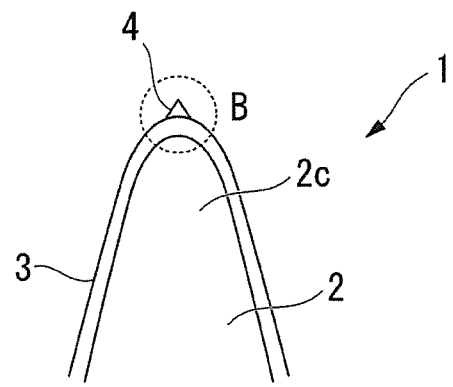
FIG. 1B is an enlarged sectional view of a distal end region A of FIG. 1A.
Figure 1C:
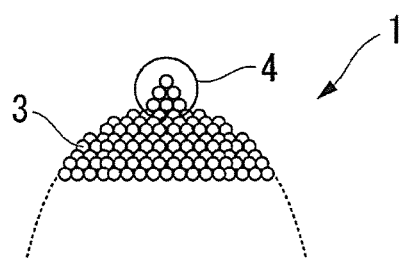
FIG. 1C is an enlarged side view of a distal end region B of FIG. 1B.

First, a tip 1 having a single-atom termination structure (hereinafter simply referred to as "single-atom termination tip 1") is described with reference to FIG. 1A to FIG. 1C. FIG. 1A is a schematic sectional view of the single-atom termination tip 1 according to a first embodiment of the present invention. FIG. 1B is an enlarged sectional view of a distal end region A of FIG. 1A. FIG. 1C is an enlarged side view of a distal end region B of FIG. 1B.

The single-atom termination tip 1 includes a thin line member 2, a covering portion 3, a protruding portion 4, and a supply portion 5. The covering portion 3 and the protruding portion 4 are formed in a distal end portion 2a of the thin line member 2. The supply portion 5 is configured to supply a raw material to the covering portion 3 and the protruding portion 4 in the vicinity of the distal end portion 2a of the thin line member 2.

The thin line member 2 has an external shape formed into a rod-like shape having a thin pointed distal end. The thin line member 2 includes a rod-like portion 2b and a tapered portion 2c contiguous to the rod-like portion 2b. The rod-like portion 2b is formed to have a diameter of about 100 μm. The distal end portion 2a of the thin line member 2 described above includes, for example, a part of the rod-like portion 2b and the tapered portion 2c. The thin line member 2 is made of a metal material having a body-centered cubic (BCC) lattice, for example, tungsten, niobium, tantalum, and molybdenum. For example, the thin line member 2 is formed of a wire of single crystal tungsten aligned in a <111> orientation, and the longitudinal direction of the thin line member 2 is aligned in the <111> orientation.

The covering portion 3 has an external shape formed into a thin film shape covering the surface of the distal end portion 2a of the thin line member 2. For example, the covering portion 3 is formed to have a thickness of about a level of a thickness of a monatomic layer. The protruding portion 4 has an external shape formed into a triangular pyramid shape protruding from a distal end of the covering portion 3. For example, the protruding portion 4 is formed to have a protruding height corresponding to a thickness of about a level of several laminated atomic layers. A distal end of the protruding portion 4 is terminated only with a single atom.

The covering portion 3 and the protruding portion 4 are made of a metal material having a face-centered cubic (FCC) lattice, for example, iridium, platinum, and palladium, or a hexagonal close-packed (HCP) metal material, for example, osmium. For example, the covering portion 3 is formed of a thin film having a thickness of about a level of a monatomic layer of iridium. For example, the protruding portion 4 is formed of an atomic laminate having a thickness of about a level of several layers of iridium, and the distal end of the protruding portion 4 is formed of only a single atom of iridium. The protruding portion 4 made of iridium is formed on a {111} crystal plane of the distal end of the thin line member 2 made of single crystal tungsten. The atomic laminate of iridium of the protruding portion 4 is formed so as to have a nanoscale triangular pyramid structure terminated with only one atom in the <111> orientation surrounded by side surfaces of three {211} crystal planes.

The supply portion 5 has an external shape formed into a lump shape fixed to the surface of the thin line member 2 in the vicinity of the distal end portion 2a. For example, the supply portion 5 is formed on the rod-like portion 2b of the thin line member 2. The supply portion 5 is a reservoir of a metal material to be supplied to the covering portion 3 and the protruding portion 4, and is made of the same metal material as those of the covering portion 3 and the protruding portion 4. For example, the supply portion 5 is made of iridium in the same manner as in the covering portion 3 and the protruding portion 4.

(Second Embodiment) Method of Manufacturing a Single-Atom Termination Tip

Figure 2:
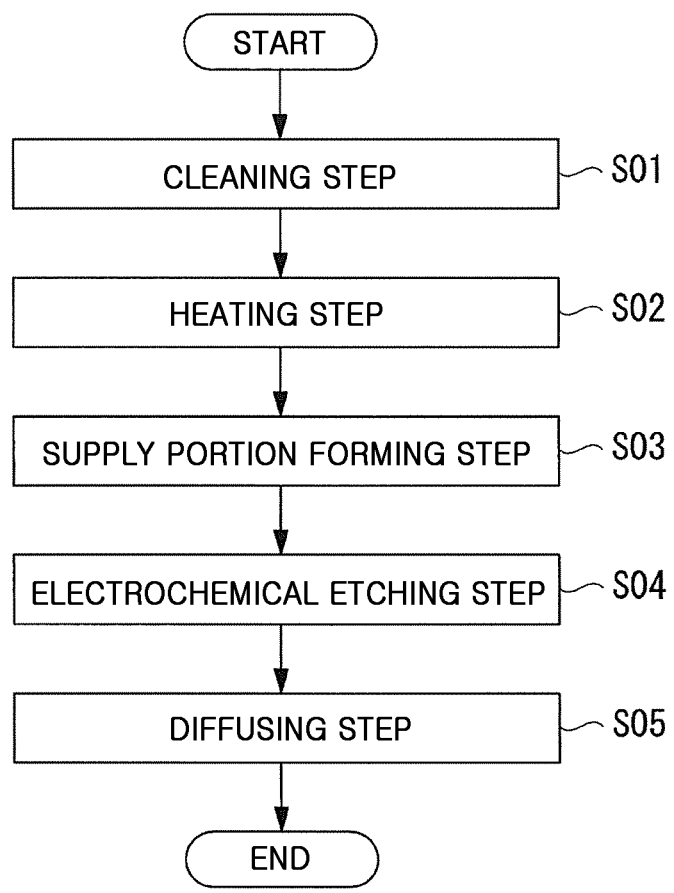
FIG. 2 is a flowchart for illustrating a method of manufacturing the tip having a single-atom termination structure according to the embodiment of the present invention.

As illustrated in FIG. 2, a method of manufacturing the single-atom termination tip 1 includes a cleaning step (Step S01), a heating step (Step S02), a supply portion forming step (Step S03), an electrochemical etching step (Step S04), and a diffusing step (Step S05). FIG. 2 is a flowchart for illustrating the method of manufacturing the tip 1 having a single-atom termination structure according to a second embodiment of the present invention.

Now, description is given of each step in the case of using, as a raw material for the thin line member 2, a rod-like member (diameter: about 0.1 mm) which is made of single crystal tungsten and has a longitudinal direction aligned in the <111> orientation and using iridium as a raw material for the covering portion 3, the protruding portion 4, and the supply portion 5.

First, in the cleaning step of Step S01, the rod-like member made of single crystal tungsten is cleaned with acetone, and further subjected to oxidation treatment with an ozone cleaner, to thereby remove impurities from the rod-like member.

Next, in the heating step of Step S02, the rod-like member is heated to about 2,300 K to remove an oxide from the rod-like member in a vacuum chamber. In Step S01 and Step S02 described above, the rod-like member having a clean surface is formed.

Next, in the supply portion forming step of Step S03, a reservoir of iridium is formed on the clean surface of the rod-like member in the vicinity of a distal end portion by deposition through sputtering action using an argon gas or spot welding using a fiber laser. For example, by sputtering using an argon gas, an iridium thin film having a thickness of about several tens of nm is deposited on the surface of the rod-like member. For example, according to spot welding using a fiber laser, an iridium small chip having a radius of about submillimeter is joined onto the surface of the rod-like member. The reservoir of iridium forms the supply portion 5 configured to supply iridium to the covering portion 3 and the protruding portion 4 in the single-atom termination tip 1.

Next, in the electrochemical etching step of Step S04, the distal end portion of the rod-like member in the vicinity of the reservoir is sharpened by electropolishing. For example, the rod-like member and a counter electrode of platinum are immersed in a solution of potassium hydroxide or the like, and an AC voltage is applied between two poles of the rod-like member and the counter electrode. The external shape of the distal end portion of the rod-like member is formed into a conical shape having a thin pointed distal end by electropolishing. The rod-like member having the sharpened distal end portion forms the thin line member 2 including the supply portion 5 in the single-atom termination tip 1.

Next, in the diffusing step of Step S05, iridium is diffused from the supply portion 5 to the distal end of the thin line member 2 by heating the thin line member 2 and applying a negative voltage thereto while observing the distal end of the thin line member 2 in a vacuum chamber of a field-emission microscope (FEM) or field-ion microscope (FIM). In this diffusing step, the thin line member 2 is accommodated in the vacuum chamber of the field-emission microscope (FEM) or field-ion microscope (FIM) in a state of being arranged in a gas field ion source 30 or electron source described later, and the thin line member 2 is heated and supplied with a voltage by a heating unit and a power source, which are provided in the gas field ion source 30 or electron source.

For example, the thin line member 2 including the supply portion 5 is arranged in the vacuum chamber of the field-emission microscope (FEM), and the periphery of the thin line member 2 is set to a vacuum state (about $10^{-9}$ Pa). Next, the thin line member 2 is heated to about 2,300 K, to thereby remove contamination (impurities and the like) adhering to the distal end portion 2a of the thin line member 2 and diffuse iridium from the supply portion 5 to the distal end of the thin line member 2. With this, a thin film having a thickness of about a level of a monatomic layer of iridium covering the distal end portion 2a of the thin line member 2 is formed. This thin film of iridium forms the covering portion 3 in the single-atom termination tip 1.

Next, a negative voltage of about an observation voltage of the field-emission microscope (FEM) is applied to the thin line member 2 while the thin line member 2 is heated to about 1,000 K, to thereby move iridium onto a {111} crystal plane of tungsten at the distal end of the thin line member 2 and form an atomic laminate having a thickness of about several layers of iridium. The atomic laminate of iridium is formed when three equivalent {211} crystal planes (facet surfaces) spread in the thin film of iridium on the {111} crystal plane of tungsten, and the distal end is pointed in the <111> orientation. In this case, in the observation image of the field-emission microscope (FEM), bright spots appear, which are formed of several iridium atoms aligned linearly in each ridge line formed between two {211} crystal planes. Then, finally, only one bright spot remains in the <111> orientation, and the distal end of the atomic laminate is formed of only one iridium atom. The atomic laminate of iridium is formed so as to have a nanoscale triangular pyramid structure terminated with only one atom in the <111> orientation surrounded by side surfaces of three {211} crystal planes and forms the protruding portion 4 in the single-atom termination tip 1.

(Third Embodiment) Method of Regenerating Single-Atom Termination Tip

The single-atom termination tip 1 according to a third embodiment of the present invention can be repeatedly restored, for example, even when the structure of the protruding portion 4 is accidentally broken by scattering of ions, reaction with residual gas, or the like.

According to the method of regenerating the single-atom termination tip 1, in the same manner as in the diffusing step of Step S05 described above, the thin line member 2 is heated and supplied with a negative voltage while the distal end of the thin line member 2 is observed in the vacuum chamber of the field-emission microscope (FEM) or field-ion microscope (FIM).

For example, the single-atom termination tip 1 is arranged in the vacuum chamber of the field-emission microscope (FEM), and the periphery of the thin line member 2 is set to a vacuum state (about $10^{-9}$ Pa). Next, a negative voltage of about an observation voltage of the field-emission microscope (FEM) is applied to the single-atom termination tip 1 while the single-atom termination tip 1 is heated to about 1,000 K or more. With this, iridium is moved to the distal end of the protruding portion 4 to regenerate the nanoscale triangular pyramid structure terminated with only one atom in the <111> orientation.

(Fourth Embodiment) Gas Field Ion Source

As a fourth embodiment of the present invention using the single-atom termination tip 1 according to the first embodiment described above, a gas field ion source (GFIS) is described.

Figure 3:
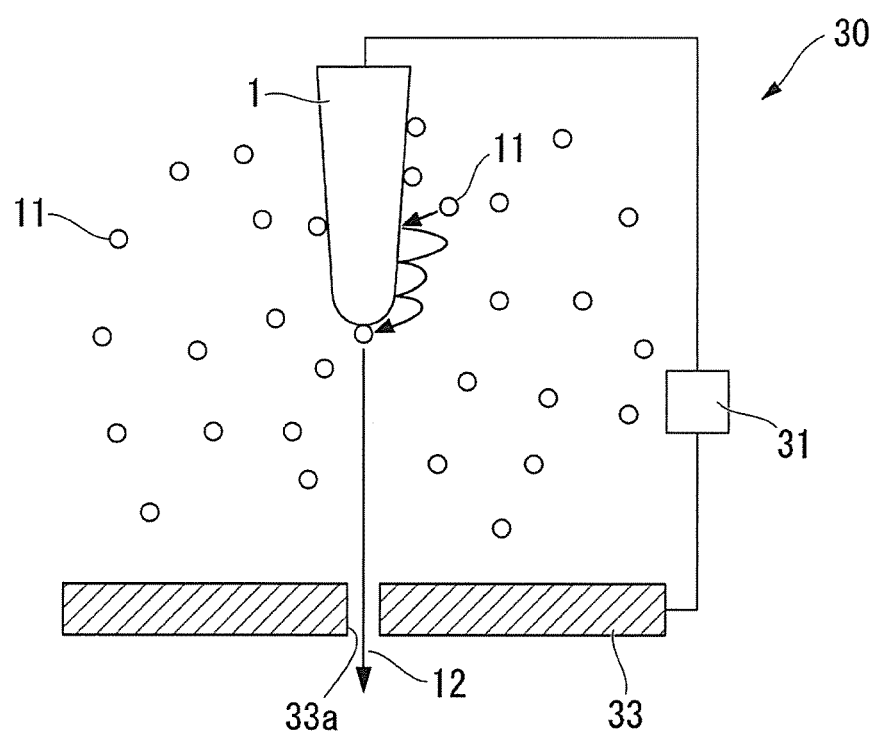
FIG. 3 is a schematic configuration diagram for illustrating ionization in a gas field ion source according to an embodiment of the present invention.

First, an ion generation principle is described with reference to FIG. 3. FIG. 3 is a schematic configuration diagram for illustrating ionization in the gas field ion source according to the fourth embodiment of the present invention. Gas to be ionized is supplied to the gas field ion source 30, and there are gas molecules and atoms (herein collectively referred to as "gas molecules") 11 to be ionized on the periphery of the cooled single-atom termination tip 1.

Then, when a voltage is applied between the single-atom termination tip 1 and an extraction electrode 33 by a power source 31, and a high electric field is generated on the periphery of the distal end of the single-atom termination tip 1, gas molecules 11 drifting on the periphery of the single-atom termination tip 1 are polarized and attracted to the distal end of the single-atom termination tip 1 by polarization force. The attracted gas molecules 11 are ionized with the high electric field at the distal end of the single-atom termination tip 1.

The generated ions 12 are emitted from an opening 33a of the extraction electrode 33 to a sample (not shown) through an ion optical system (not shown) on a downstream side. In the gas field ion source 30, the size of a region in which a beam of the ions 12 (ion beam) is emitted, that is, the source size of an ion source is extremely small. Therefore, the ion source has high brightness, and an extremely thin focused ion beam can be formed on the sample.

Figure 4:
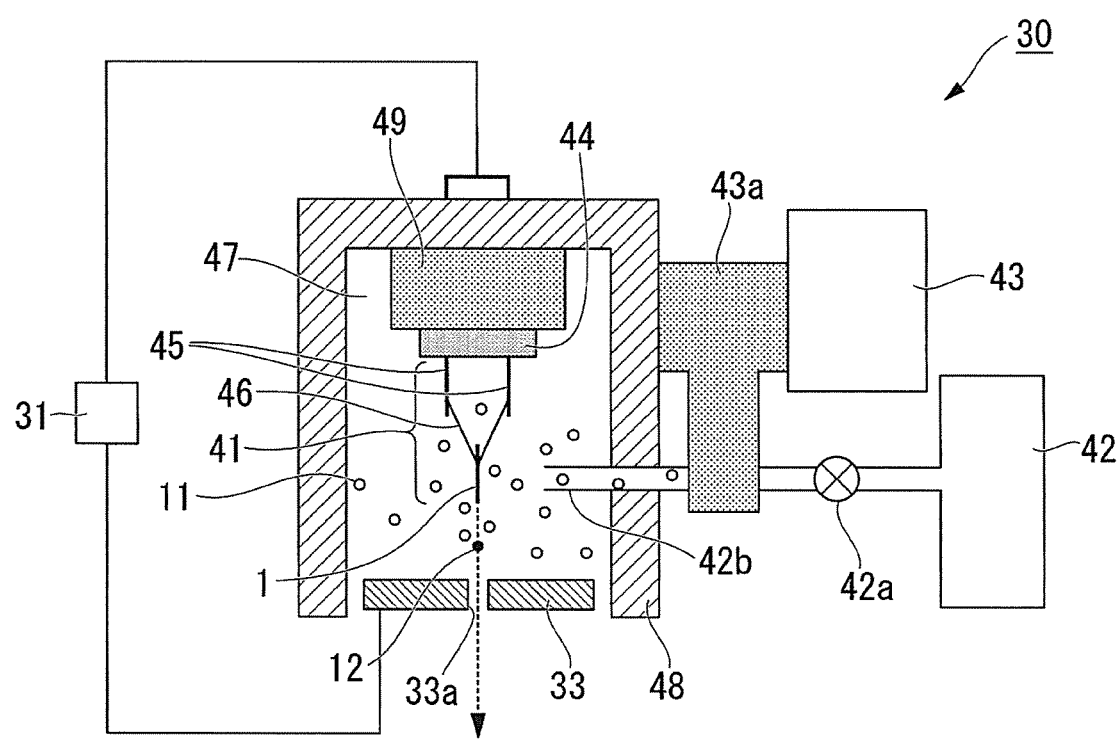
FIG. 4 is a schematic configuration diagram for illustrating a structure of the gas field ion source according to the embodiment of the present invention.

Now, a basic configuration of the gas field ion source 30 is described with reference to FIG. 4. FIG. 4 is a schematic configuration diagram of the gas field ion source 30 according to the fourth embodiment of the present invention.

The gas field ion source 30 includes the power source 31, the extraction electrode 33, a tip structure 41, an ion source gas supply unit 42, and a cooling device 43.

The power source 31 is a current power source of a high voltage. The power source 31 is connected to the extraction electrode 33 and a pair of conductive pins 45, which are to be described later. The power source 31 is electrically connected to the single-atom termination tip 1 through the pair of conductive pins 45 and filaments 46. A voltage output from the power source 31, a current conducted from the power source 31 to the filaments 46, and the like are controlled by an external computer connected to the power source 31. The external computer is, for example, a control unit 53 of a focused ion beam apparatus 50, which is to be described later.

When a beam of the ions 12 is generated from the gas field ion source 30, and the single-atom termination tip 1 is manufactured and regenerated as described above, the power source 31 applies a voltage between the extraction electrode 33 and the single-atom termination tip 1. The power source 31 is constructed to be able to switch a positive state and a negative state of the voltage applied to the extraction electrode 33 and the single-atom termination tip 1. For example, when the ions 12 are generated, the power source 31 ionizes the gas molecules 11 to generate the ions 12 at the distal end of the single-atom termination tip 1 by applying a predetermined positive voltage required for ionization to the single-atom termination tip 1 with the extraction electrode 33 being set to a ground potential, and extracts the ions 12 to the extraction electrode 33 side. For example, in the diffusing step of Step S05 described above, the power source 31 applies a predetermined negative voltage to the single-atom termination tip 1 with the extraction electrode 33 being set to a ground potential, to thereby diffuse the raw material of the protruding portion 4 from the supply portion 5 to the distal end of the thin line member 2 and terminate the distal end of the protruding portion 4 only with a single atom.

The extraction electrode 33 is arranged at a distance from the distal end of the single-atom termination tip 1 and has the opening 33a formed therein. The extraction electrode 33 is configured to guide the ions 12 emitted from the single-atom termination tip 1 to the ion optical system (not shown) on the downstream side of the opening 33a.

The tip structure 41 includes an insulating base member 44, the pair of conductive pins 45 fixed to the base member 44, the filaments 46 each being formed of a thin line of tungsten connected between distal end portions of the pair of conductive pins 45, and the single-atom termination tip 1 that is electrically and mechanically fixed to the filaments 46. The single-atom termination tip 1 is connected to the filaments 46 by point welding, and is configured to emit the ions 12 from the distal end portion.

The pair of conductive pins 45 are connected to the power source 31. The filaments 46 are configured to apply a voltage output from the power source 31 to the single-atom termination tip 1 through the pair of conductive pins 45 and heat the single-atom termination tip 1 with Joule heat generated from a current conducted from the power source 31 through the pair of conductive pins 45. For example, the filaments 46 (diameter: about 0.25 mm) made of an alloy material of tungsten and rhenium are heated to about 2,000 K or more with Joule heat. The filaments 46 form the heating unit from the viewpoint of the heating action of Joule heat, and are configured to heat the single-atom termination tip 1 at times of manufacturing and regeneration of the single-atom termination tip 1 as described above. For example, when heating and cleaning of the single-atom termination tip 1 are performed in the heating step of Step S02 described above, and when the distal end of the protruding portion 4 is terminated only with a single atom in the diffusing step of Step S05 described above and the like, the filaments 46 heat the single-atom termination tip 1 to respective predetermined temperatures.

The heating unit is not limited to the filaments 46 and may be, for example, a heater connected to the single-atom termination tip 1. The heater can adjust the temperature of the single-atom termination tip 1 and may be used for heating and cleaning the surface of the single-atom termination tip 1, terminating the distal end of the protruding portion 4 of the single-atom termination tip 1 only with a single atom, and the like.

The ion source gas supply unit 42 can supply a trace amount of gas (for example, a helium gas) made of the gas molecules 11 to be ionized to the periphery of the single-atom termination tip 1 and communicates to an ion source chamber 47 through a gas introduction pipe 42b so that a flow rate can be adjusted by a valve 42a. The gas species provided in the ion source gas supply unit 42 is not limited to one species. Gas cylinders of a plurality of gas species (not shown) may be set, and the gas species may be switched as necessary to be supplied to the ion source chamber 47. Alternatively, the plurality of gas species may be mixed to be supplied to the ion source chamber 47.

Gas to be supplied from the ion source gas supply unit 42 to the ion source chamber 47, that is, raw material gas for forming a focused ion beam may be rare gas, such as helium, neon, argon, krypton, and xenon, or may be molecular gas, such as hydrogen, oxygen, and nitrogen. The raw material gas may be mixed gas of those gas species.

The cooling device 43 is configured to cool the single-atom termination tip 1 and the gas supplied from the ion source gas supply unit 42 to the ion source chamber 47 with refrigerant, such as liquid helium or liquid nitrogen. Low-temperature refrigerant generated in the cooling device 43 is brought into contact with a wall surface 48 surrounding the tip structure 41 and the gas introduction pipe 42b through a connecting portion 43a, to thereby cool the inside of the ion source chamber 47 as well as the wall surface 48 and the gas introduction pipe 42b.

The cooling device 43 is not limited to the above-mentioned configuration. It is only required that the cooling device 43 cool at least the single-atom termination tip 1, and the cooling device 43 may have a configuration including, for example, a cooling block or a freezing machine. Further, a cold head 49 configured to transfer heat of the single-atom termination tip 1 is arranged between the ion source chamber 47 and the tip structure 41. The cold head 49 is formed into a block shape through use of alumina or sapphire, or a ceramics material, for example, aluminum nitride, and is fixed to the base member 44.

(Fifth Embodiment) Focused Ion Beam Apparatus

A fifth embodiment of the present invention is directed to a focused ion beam apparatus including a gas field ion source. The focused ion beam apparatus is also called a scanning ion microscope (SIM). An apparatus configured to mainly perform processing (for example, opening of a hole, formation of a cross section, and formation of a deposition film) of a target sample and observation thereof is called a focused ion beam apparatus. An apparatus configured to perform only observation of the shape of the target sample is called a scanning ion microscope. Thus, in the focused ion beam apparatus, ion species capable of actively sputtering the target sample are used, and in the scanning ion microscope, ions of light elements, such as hydrogen and helium, which do not easily sputter the target sample and have a small mass, are used. In any of the apparatus, focusing of an ion beam and long-term stability of ion beam emission are commonly required, and the configurations of an ion source, an ion beam focusing optical system, a cooling unit, a vacuum pumping device, and the like are basically common.

Figure 5:
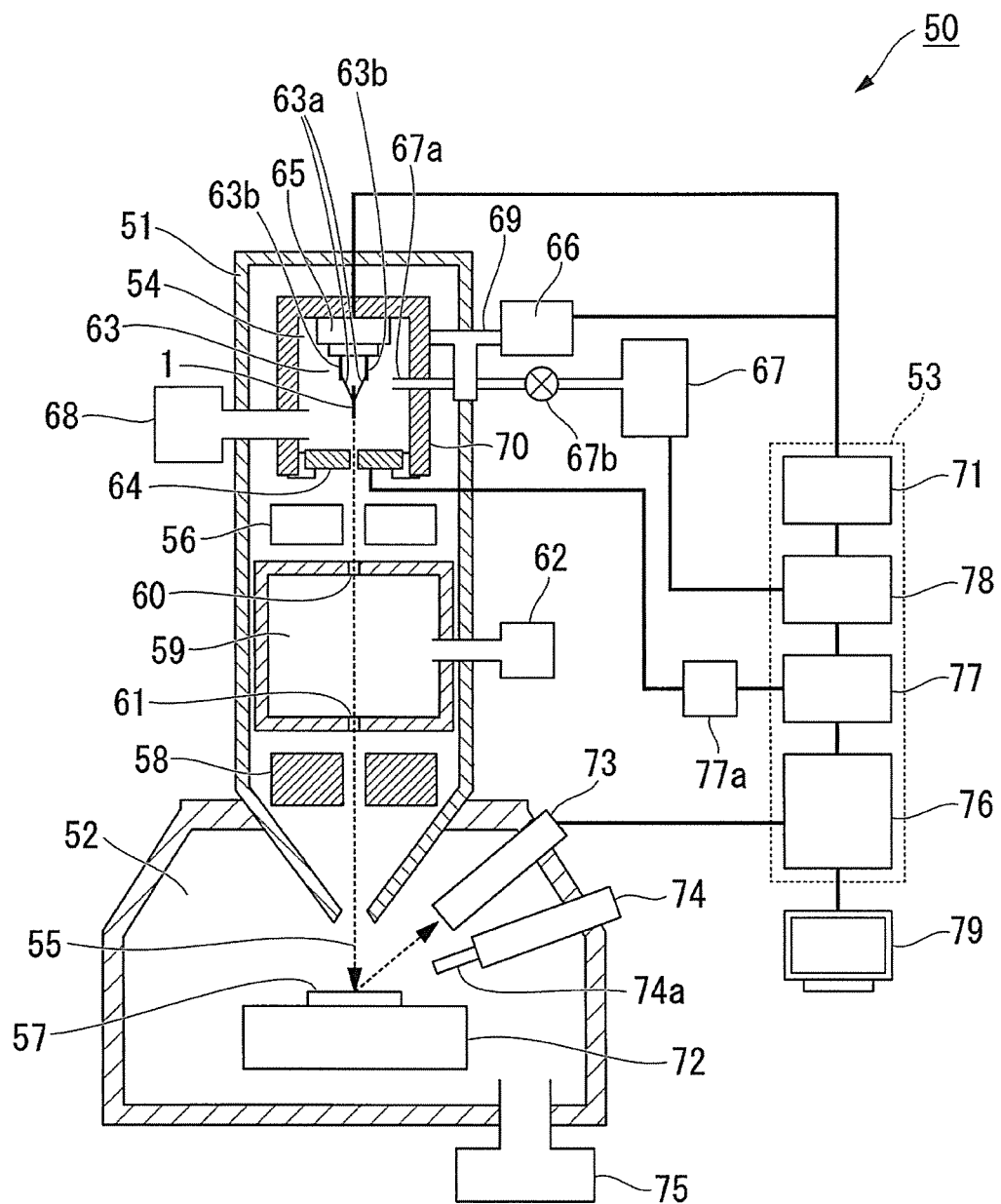
FIG. 5 is a schematic configuration diagram for illustrating a structure of a focused ion beam apparatus according to an embodiment of the present invention.

FIG. 5 is a schematic configuration diagram of the focused ion beam apparatus 50 according to the fifth embodiment of the present invention. The focused ion beam apparatus 50 mainly includes an ion beam lens barrel 51, a sample chamber 52, and the control unit 53.

The ion beam lens barrel 51 includes an ion source chamber 54, a condenser lens electrode 56, and an objective lens electrode 58. The ion source chamber 54 includes the single-atom termination tip 1 configured to generate ions. The condenser lens electrode 56 is configured to condense the ions emitted from the ion source chamber 54 to a focused ion beam 55. The objective lens electrode 58 is configured to focus the focused ion beam 55 onto a sample 57.

Further, the ion beam lens barrel 51 includes an intermediate chamber 59 between the ion source chamber 54 and the sample chamber 52, and orifices 60 and 61 between the ion source chamber 54 and the intermediate chamber 59 and between the sample chamber 52 and the intermediate chamber 59. The focused ion beam 55 is radiated to the sample 57 through the orifices 60 and 61.

The intermediate chamber 59 is connected to a vacuum pump 62 so that the vacuum degree can be adjusted by the vacuum pump 62, and the intermediate chamber 59 can perform differential pumping between the sample chamber 52 and the ion source chamber 54.

The ion source chamber 54 includes a gas field ion source 63 and an extraction electrode 64. The gas field ion source 63 includes the single-atom termination tip 1, and is configured to emit the focused ion beam 55. The extraction electrode 64 is configured to form an electric field for extracting the focused ion beam 55 to the periphery of the single-atom termination tip 1.

The single-atom termination tip 1 is connected to a heater forming the heating unit. The heater 65 can adjust the temperature of the single-atom termination tip 1 and is used for heating and cleaning the surface of the single-atom termination tip 1, terminating the distal end of the protruding portion 4 of the single-atom termination tip 1 only with a single atom, and the like.

The heating unit is not limited to the heater 65. The heating unit may be, for example, a pair of filaments 63a connected to the single-atom termination tip 1 in the gas field ion source 63 in the same manner as in the gas field ion source 30 according to the fourth embodiment described above. The pair of filaments 63a are connected to a pair of conductive pins 63b.

Further, the ion source chamber 54 is connected to a cooling device 66 configured to cool the single-atom termination tip 1, an ion source gas supply unit 67 configured to supply ion source gas into the ion source chamber 54, a vacuum pump 68 configured to set the ion source chamber 54 to a vacuum state, and the like.

The cooling device 66 is configured to cool the single-atom termination tip 1 or the ion source gas supplied from the ion source gas supply unit 67 to the ion source chamber 54 with refrigerant, such as liquid nitrogen or liquid helium. For example, the cooling device 66 is configured to cool the single-atom termination tip 1 and the ion source gas through a connecting portion 69 for connecting the ion source chamber 54 and a wall portion 70 of the ion source chamber 54.

The ion source gas supplied from the ion source gas supply unit 67 may be rare gas, such as helium, neon, argon, krypton, and xenon, or may be molecular gas, such as hydrogen, oxygen, and nitrogen. The ion source gas is emitted as ions from the distal end of the single-atom termination tip 1, and the energy distribution width of the focused ion beam 55 is extremely small. Therefore, the influence of chromatic aberration can be suppressed to be small. The gas field ion source 63 in the fifth embodiment serves as a high-brightness ion source having an ion generation region that is extremely small, as compared to that of, for example, a plasma-type gas ion source or liquid metal ion source that has hitherto been known. In the fifth embodiment, the ion source gas is nitrogen. Nitrogen is field-ionized at a relatively low field intensity (for example, 17 V/nm), but foreign matter that physically adsorbs to the surface of the single-atom termination tip 1 is desorbed at a field intensity lower than the above-mentioned field intensity. Therefore, when nitrogen is ionized, the foreign matter is removed from the surface of the single-atom termination tip 1.

Further, hydrogen (field intensity of field ionization: about 22 V/nm), helium (field intensity of field ionization: about 44 V/nm), neon (field intensity of field ionization: about 35 V/nm), argon (field intensity of field ionization: about 22 V/nm), and the like are not ionized unless the electric field is strong, as compared to nitrogen. Therefore, even when those gases remain in the ion source chamber 54, those gases are not ionized. Consequently, it is not required that nitrogen supplied from the ion source gas supply unit 67 have particularly ultra-high purity. With this, the cost required for operating the apparatus can be reduced.

Now, the temperature control of the single-atom termination tip 1 is described.

When the temperature of the single-atom termination tip 1 is low, the adsorption density of the gas molecules increases. Thus, the current amount of the focused ion beam 55 can be increased by lowering the temperature of the single-atom termination tip 1. However, when the temperature of the single-atom termination tip 1 is lowered, the gas molecules adsorb to the wall portion 70 of the ion source chamber 54 or the connecting portion 69 between the cooling device 66 and the ion source chamber 54 to be solidified in some cases depending on the gas species and the cooling temperature. The solidified gas molecules are concurrently vaporized when the temperature of the ion source chamber 54 is raised. Therefore, there is a risk in that the gas partial pressure in the ion source chamber 54 abruptly increases, and the operation of the gas field ion source becomes unstable and causes discharge, to thereby damage the tip distal end.

The cooling temperature of the single-atom termination tip 1 varies depending on the gas species of the ion source gas supplied from the ion source gas supply unit 67, but in the fifth embodiment, the cooling temperature can be set within a range of from about 40 K to about 200 K by a temperature control unit 71. With this, an ion beam having a current amount required for fine processing can be stably radiated.

The focused ion beam of the gas ions enables the surface of the sample 57 to be observed with secondary electrons generated from an irradiation portion (not shown) of the sample 57, and enables processing (for example, opening of a hole and removal of a surface layer) of the surface of the sample 57 by sputtering of the sample 57 with the ions radiated to the sample 57.

Further, the ion source gas supply unit 67 includes a gas storage portion (not shown) and a nozzle 67a. The gas storage portion is configured to store the ion source gas, and the nozzle 67a is configured to supply the ion source gas to the vicinity of the single-atom termination tip 1. The ion source gas supply unit 67 also includes a high precision valve 67b provided between the nozzle 67a and the ion source gas supply unit 67. With this, the ion source gas can be actively supplied to the distal end of the single-atom termination tip 1 while the flow rate is adjusted.

The vacuum pump 68 is configured to increase the vacuum degree of the ion source chamber 54, and in the gas field ion source 63, the vacuum degree before the ion source gas is supplied is kept as high as, for example, from about $1\times10^{-5}$ Pa to about $1\times10^{-8}$ Pa.

Further, the ion beam lens barrel 51 includes a detector (not shown) configured to obtain a field-ion microscope (FIM) image for confirming the atomic arrangement at the distal end of the single-atom termination tip 1 of the gas field ion source 63. This detector can move with respect to an ion beam axis, and when it is not required to confirm the FIM image, the detector can also be positioned away from the ion beam axis to stand by. The detector can confirm the atomic arrangement at the distal end of the single-atom termination tip 1 as necessary, for example, when an ion current becomes unstable or an observation image is disturbed.

The sample chamber 52 accommodates a sample stage 72 configured to move the sample 57 to the irradiation position of the focused ion beam 55 radiated from the ion beam lens barrel 51. The sample stage 72 is operated based on an instruction of an operator and the like and can be displaced in five axes. That is, the sample stage 72 is supported by a displacement mechanism (not shown). The displacement mechanism includes an XYZ-axis mechanism (not shown) configured to move the sample stage 72 along an X-axis and a Y-axis orthogonal to each other on the same plane and a Z-axis orthogonal to the X-axis and the Y-axis, a tilt axis mechanism (not shown) configured to rotate and tilt the sample stage 72 about the X-axis or the Y-axis, and a rotation mechanism (not shown) configured to rotate the sample stage 72 about the Z-axis.

The sample chamber 52 includes a detector 73 configured to detect secondary ions or secondary electrons generated by scanning and irradiation with the focused ion beam 55. With this, an observation image can be generated based on a detection signal of the secondary ions or the secondary electrons and a scanning signal of the focused ion beam 55. When a reflected ion detector is used as the detector 73, a reflected ion image can be formed by detecting reflected ions generated from the sample 57.

Further, the sample chamber 52 includes a gas supply unit 74 capable of spraying gas to the sample 57 during irradiation with the focused ion beam 55. The gas supply unit 74 includes a gas storage portion (not shown) configured store gas and a nozzle portion 74a configured to spray the gas to the vicinity of the sample 57. The gas supply unit 74 may include a gas flow rate adjusting portion (not shown), for example, a mass flow controller, configured to adjust the flow rate of gas. A deposition film can be formed on the surface of the sample 57 by irradiating the sample 57 with the focused ion beam 55 while spraying deposition gas, for example, carbon-based gas or carbon-based compound gas containing a metal, for example, platinum or tungsten, from the gas supply unit 74 to the irradiation portion (not shown) of the sample 57. Meanwhile, foreign matter on the surface of the sample 57 can be selectively removed, or the surface of the sample 57 can be processed at a speed higher than that of processing using sputtering, by irradiating the sample 57 with the focused ion beam 55 while spraying halogen-based etching gas, such as iodine, from the gas supply unit 74 to the sample 57.

Further, the sample chamber 52 is connected to a vacuum pump 75 capable of adjusting the vacuum degree in the sample chamber 52.

The control unit 53 includes an image forming unit 76, a power source control unit 77, an ion source gas control unit 78, and a temperature control unit 71. Further, the control unit 53 can control the application of a voltage to a condenser lens electrode (not shown), an objective lens electrode (not shown), and the like, the movement of the sample stage 72, and the like.

The image forming unit 76 is configured to generate an observation image based on a detection signal output from the detector 73 and display the generated observation image on a display unit 79. Thus, when the sample 57 is irradiated with the focused ion beam 55, and the generated secondary ions or secondary electrons are detected by the detector 73, the observation image of the sample 57 can be displayed on the display unit 79 so as to be observed. Further, the form of the surface of the sample 57 can be detected by detecting the secondary electrons with the detector 73, and the distribution of elements forming the sample 57 can be detected by detecting the secondary ions with the detector 73.

The power source control unit 77 is configured to control a power source 77a. The power source 77a is a high-voltage current power source. The power source 77a is connected to the extraction electrode 64 and the pair of conductive pins 63b. The power source 77a is electrically connected to the single-atom termination tip 1 through the pair of conductive pins 63b and the filaments 63a. The power source control unit 77 is configured to control a voltage to be applied between the extraction electrode 64 and the single-atom termination tip 1 by the power source 77a. For example, when an emission ion current is adjusted, and the single-atom termination tip 1 is manufactured or regenerated, the power source control unit 77 controls the voltage to be applied between the extraction electrode 64 and the single-atom termination tip 1.

Further, for example, when the filaments 63a of the gas field ion source 63 are caused to serve as the heating unit at a time of manufacturing or regeneration of the single-atom termination tip 1, the power source control unit 77 controls a current conducted from the power source 77a to the single-atom termination tip 1 through the pair of conductive pins 63b and the filaments 63a.

The ion source gas control unit 78 is configured to control the ion source gas supply unit 67 including a gas flow rate adjusting portion (not shown), for example, a mass flow controller, configured to adjust the flow rate of the ion source gas.

The temperature control unit 71 can control the cooling device 66 configured to lower the temperature of the single-atom termination tip 1 or the temperature of the ion source gas, and the heater 65 used for heating and cleaning the single-atom termination tip 1 and terminating the distal end of the protruding portion 4 of the single-atom termination tip 1 only with a single atom. Further, for example, when the filaments 63a of the gas field ion source 63 are caused to serve as the heating unit, the temperature control unit 71 can control a current conducted from the power source 77a to the filaments 63a in cooperation with the power source control unit 77.

According to the focused ion beam apparatus 50, the surface form and the element distribution of the sample 57 can be visualized with high resolution, and hence the focused ion beam apparatus 50 having long operating life and high stability can be provided.

In the fifth embodiment described above, the focused ion beam apparatus 50 is described. However, a composite apparatus (ion electron composite beam apparatus) may be constructed, in which a scanning electron microscope lens barrel is mounted on the focused ion beam apparatus 50 so that the focused ion beam 55 and the electron beam are radiated to substantially the same position of the surface of a sample.

Further, the scanning electron microscope may be an electron microscope in which an electron source including the single-atom termination tip 1 described later in a sixth embodiment of the present invention is mounted, and this electron microscope enables a high-precision image to be formed by a focused ion beam and an electron beam.

Further, the following is also possible. A secondary ion detector is mounted on the focused ion beam apparatus 50 described above, and secondary ions generated from the irradiation portion (not shown) of a sample are analyzed to identify elements forming the irradiation portion. For example, a certain region is scanned with a focused ion beam and analyzed for elements, with the result that a map of particular elements can be created. In contrast, in analysis of secondary ions using a related-art gallium focused ion beam apparatus, gallium implanted into a sample is also detected, and hence there arises a problem in that the secondary ions cannot be discriminated from gallium that is originally contained in the sample. Further, in the focused ion beam apparatus 50 according to the fifth embodiment, focusing of a beam is satisfactory as compared to that in the related-art gallium focused ion beam apparatus, and hence element analysis of a finer region can be performed.

(Sixth Embodiment) Electron Microscope

An electron microscope is, more specifically, roughly classified into a scanning electron microscope (SEM), a transmission electron microscope (TEM), a scanning transmission electron microscope (STEM), and the like. Those electron microscopes are common in that electrons generated from an electron source are formed into a beam to be radiated to a sample. The scanning electron microscope is configured to generate an image with secondary electrons generated from an irradiation region of a focused electron beam. In general, the transmission electron microscope can perform observation with a magnification higher than that of the scanning electron microscope by irradiating a thin film sample with a focused electron beam and enlarging an electron beam having passed through the thin film sample so as to form an image. The scanning transmission electron microscope is configured to obtain an enlarged image of a fine region by scanning a focused electron beam onto a thin film sample and enlarging an image having passed through the thin film sample. It is desired that those electron microscopes obtain an image with a high magnification and a high resolution. There has hitherto been known a technology using an electron source in which a distal end is formed of only one atom so as to achieve high resolution of an image to be obtained. However, there is a problem in that desired stability and operating life (for example, a time period during which a tip distal end can be continuously used without being regenerated) cannot be ensured.

In a sixth embodiment of the present invention, the single-atom termination tip 1 described in the first embodiment was used as an electron source of the scanning electron microscope. The electron source has the same configuration as that of the tip structure 41 of the gas field ion source 30 according to the fourth embodiment illustrated in FIG. 4, and in addition, can be removably mounted on various electron microscopes. The electron source is configured to heat the filaments 46 with a current introduced from the pair of conductive pins 45 and clean the single-atom termination tip 1 by heating, and to be able to form and regenerate the protruding portion 4 having a distal end terminated only with a single atom.

The vacuum degree of an electron source chamber (corresponding to the ion source chamber 47 illustrated in FIG. 4) including the single-atom termination tip 1 is set to, for example, an ultra-high vacuum state of about $10^{-9}$ Pa. The resolution of an SEM image of the scanning electron microscope according to the sixth embodiment is less than 1 nm, which is much more excellent than that of the related-art scanning electron microscope.

When the scanning electron microscope according to the sixth embodiment is operated for a long time period, a fluctuation in beam current of emitted electrons caused by the adsorption of impurity atoms or molecules remaining in the apparatus including the electron source to the single-atom termination tip 1 is sufficiently smaller than that of the related-art electron source.

In the sixth embodiment, the scanning electron microscope is described. However, even when the electron source in the sixth embodiment is mounted on a transmission electron microscope (TEM) or a scanning transmission electron microscope (STEM), the same effects as those described above can be exhibited. Further, when an energy dispersive X-ray spectrometer is mounted on each of the electron microscopes according to the sixth embodiment, and element analysis of an electron beam irradiation region is performed, measurement data with high resolution can be obtained.

Further, the electron source in the sixth embodiment can also be used as an electron source of an electron beam application analyzer, for example, an electron probe microanalyzer and an Auger electron spectroscope. The electron probe microanalyzer is an apparatus configured to analyze constituent elements based on the wavelength and intensity of characteristic X-rays generated by irradiating an object with an electron beam. Further, the Auger electron spectroscope is an apparatus configured to measure an energy distribution of Auger electrons generated by irradiating an object with an electron beam, and identify and quantify elements. In any of the apparatus, the fineness of an electron beam to be radiated enhances analysis resolution, and the long-term and high-stability emission of the electron beam leads to enhancement of reliability of analysis data. Therefore, the electron source in the sixth embodiment achieves the foregoing.

(Seventh Embodiment) Photomask Repair Apparatus

Figure 6:
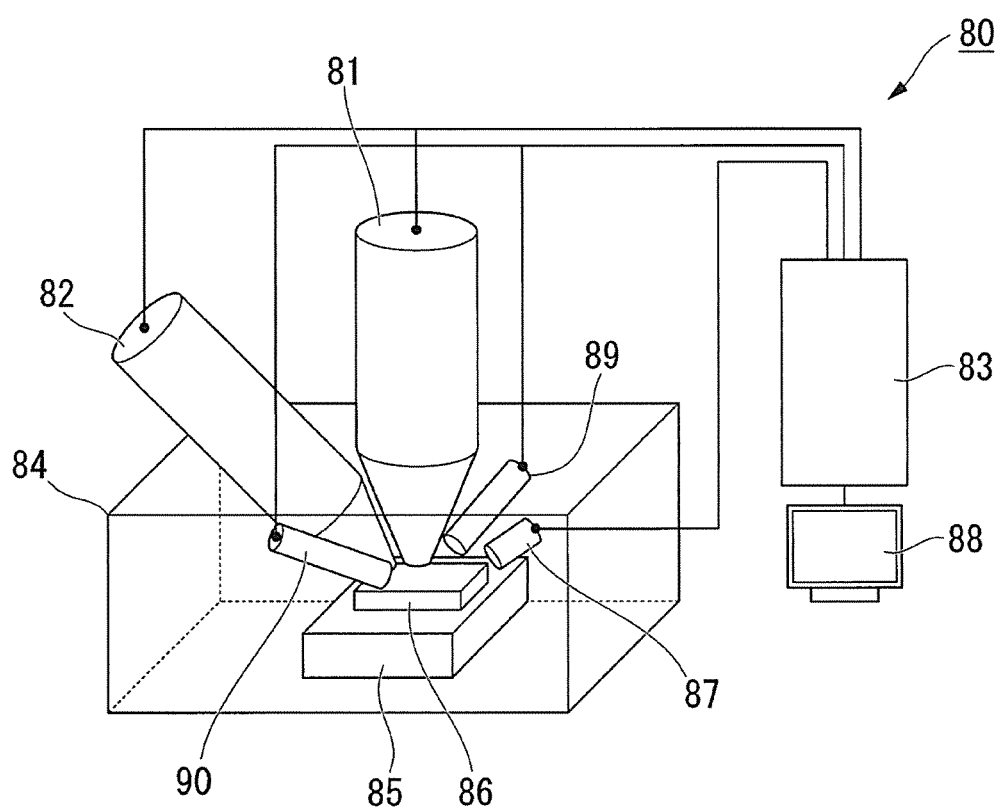
FIG. 6 is a schematic configuration diagram for illustrating a structure of a mask repair apparatus according to an embodiment of the present invention.

Now, a mask repair apparatus 80 having the gas field ion source 30 according to the fourth embodiment, which has been described above, mounted thereon is described. FIG. 6 is a schematic configuration diagram of the mask repair apparatus 80 according to a seventh embodiment of the present invention.

The mask repair apparatus 80 according to the seventh embodiment is configured to repair a defect of a photomask to be used in a pattern exposure apparatus (not shown) at a time of manufacturing a semiconductor element and the like. The mask repair apparatus 80 includes an ion beam lens barrel 81, an electron beam lens barrel 82, a control unit 83, and a sample chamber 84.

Now, a method of repairing a photomask having a defect is described.

First, the mask repair apparatus 80 includes a detector 87 and a monitor 88. The detector 87 is configured to irradiate a photomask 86 mounted on a sample stage 85 in the sample chamber 84 with an ion beam from the ion beam lens barrel 81 and detect secondary electrons or secondary ions generated from an irradiated portion. The monitor 88 can display, as an observation image, the results detected by the detector 87. Further, the mask repair apparatus 80 includes the electron beam lens barrel 82 configured to emit electrons for neutralizing electric charge caused by the irradiation with the ion beam. The monitor 88 can also display various control values.

The mask repair apparatus 80 includes a deposition gas supply unit 89 and an etching gas supply unit 90.

The deposition gas supply unit 89 can supply deposition gas onto the photomask 86. With this, each film of carbon, silicon oxide, and tungsten can be formed on the photomask 86 by irradiating the photomask 86 with deposition gas, for example, carbon-based gas, silane-based gas, or carbon-based compound gas containing a metal, for example, tungsten, while irradiating the photomask 86 with the ion beam.

The etching gas supply unit 90 can supply halogen-based etching gas, such as iodine, to a defect of the photomask 86. With this, processing can be performed at high speed or only a desired material can be selectively processed by irradiating the photomask 86 with a nitrogen ion beam while supplying etching gas thereto, as compared to the case in which etching gas is not introduced.

The mask repair apparatus 80 is configured to detect a chipped portion of a pattern and a defect of an unnecessary pattern that are present in a part of a light-shielding pattern portion with reference to a secondary electron observation image of the photomask 86 formed by the ion beam. For example, the mask repair apparatus 80 can detect chipping based on the comparison between the preliminary photomask design information and the secondary electron observation image of the surface of a produced photomask or the comparison between the secondary electron observation image of a region in which it is suspected that a defect is present and the secondary electron observation image of a normal region. Coordinate information on a defect position, the type of a defect, image information on the defect, and the like can be stored in the control unit 83 of the mask repair apparatus 80 or can be used for obtaining information from external information equipment.

Further, the mask repair apparatus 80 can calculate an optimum repair method involving setting a state after repair to be equivalent to that of the normal region in consideration of the position of the defect, the size of the defect, the discrimination of the defect form between a chipping defect and an unnecessary pattern defect, and control the ion beam lens barrel 81, the electron beam lens barrel 82, the deposition gas supply unit 89, and the etching gas supply unit 90 based on the calculation results.

Further, regarding the chipped portion present in the photomask 86, the mask repair apparatus 80 can fill the chipped portion by irradiating the chipped portion with the ion beam from the ion beam lens barrel 81 while spraying appropriate deposition gas to the chipped portion from the deposition gas supply unit 89.

Further, regarding the unnecessary pattern present in the photomask 86, the mask repair apparatus 80 can remove the unnecessary pattern through etching by irradiating the unnecessary pattern with the ion beam from the ion beam les barrel 81 while spraying the etching gas to the unnecessary pattern from the etching gas supply unit 90. Heavy ions, which decrease light transmittance of a region to be transparent of the photomask 86, are not implanted.

Thus, the photomask 86 is brought into a state in which a pattern can be normally transferred without transfer of the defect even when exposed to light. That is, the mask repair apparatus 80 can repair the photomask 86 to a normal state.

The mask repair apparatus 80 is configured to associate the secondary electron observation image of the repaired portion with the secondary electron observation image before repair and the secondary electron observation image of the normal region, and store the resultant in the control unit 83 or the external information equipment so that the result of the repair can be confirmed after repair processing. The mask repair apparatus 80 can perform such a series of operations fully automatically.

The mask repair apparatus 80 according to the seventh embodiment, which is capable of forming an ion beam with the gas field ion source 30 including the single-atom termination tip 1 in the third embodiment described above, can repair a photomask stably and highly accurately for a long time period while being capable of stably forming a beam for a long time period as described above.

Modification Example 1

In the method of manufacturing the single-atom termination tip 1 according to the second embodiment described above, a reservoir is formed in the vicinity of the distal end portion of the rod-like member by deposition through sputtering action or spot welding using a fiber laser, but the present invention is not limited thereto. For example, the reservoir may be formed in the vicinity of the distal end portion of the rod-like member by vapor deposition, electroplating, or the like.

Modification Example 2

In the method of manufacturing the single-atom termination tip 1 according to the second embodiment described above, the rod-like member made of single crystal tungsten is used as a raw material for the thin line member 2, but the present invention is not limited thereto. For example, a rod-like member made of polycrystalline tungsten may be used as a raw material for the thin line member 2.

Further, in the first embodiment and the second embodiment described above, the triangular pyramid structure is formed at the distal end of the thin line member 2 made of single crystal tungsten aligned in the <111> orientation, but the crystal orientation is not limited thereto. For example, a needle-like member made of polycrystalline tungsten aligned in the <110> orientation may be used. In this case, the triangular pyramid structure is formed in the <111> orientation different from the alignment azimuth of the needle-like member.

Modification Example 3

In the second embodiment described above, the electrochemical etching step of Step S04 is performed after the supply portion forming step of Step S03, but the present invention is not limited thereto. That is, in the second embodiment, the reservoir of iridium is formed on the rod-like member, and then the distal end of the rod-like member is sharpened. However, the present invention is not limited thereto, and the reservoir may be formed on the rod-like member after the distal end of the rod-like member is sharpened.

Figure 7:
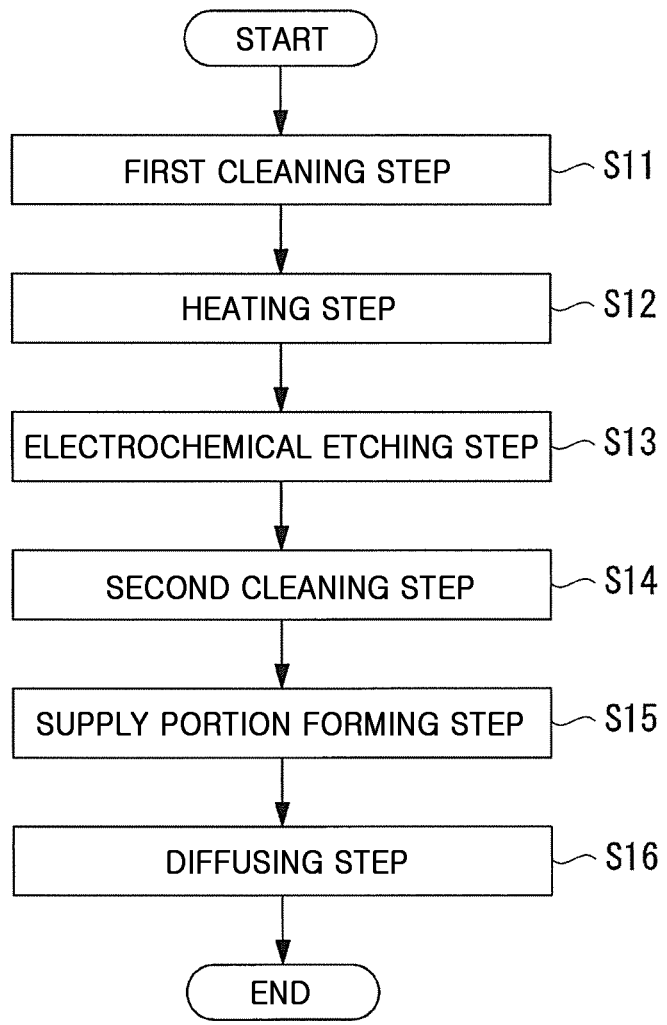
FIG. 7 is a flowchart for illustrating a method of manufacturing a tip having a single-atom termination structure according to Modification Example 3 in the embodiment of present invention.

FIG. 7 is a flowchart for illustrating a method of manufacturing the tip 1 having a single-atom termination structure according to Modification Example 3 in the embodiment of the present invention. As illustrated in FIG. 7, the method of manufacturing the single-atom termination tip 1 according to Modification Example 3 includes a first cleaning step (Step S11), a heating step (Step S12), an electrochemical etching step (Step S13), a second cleaning step (Step S14), a supply portion forming step (Step S15), and a diffusing step (Step S16).

First, the first cleaning step of Step S11 and the heating step of Step S12 are the same as the cleaning step of Step S01 and the heating step of Step S02 in the embodiment.

Next, the electrochemical etching step of Step S13 is substantially the same as the electrochemical etching step of Step S04 in the embodiment, and includes sharpening the distal end portion of the rod-like member by electropolishing.

Next, the second cleaning step of Step S14 includes cleaning the sharpened rod-like member with water and acetone to remove impurities such as an electrolyte solution.

Next, the supply portion forming step of Step S15 and the diffusing step of Step S16 are the same as the supply portion forming step of Step S03 and the diffusing step of Step S05 in the embodiment.

The technical scope of the present invention is not limited to the above-mentioned embodiments and encompasses the above-mentioned embodiments that are variously modified within a range not departing from the spirit of the present invention. That is, the configurations of the above-mentioned embodiments are described merely for illustrative purposes and can be appropriately modified.

What is claimed is:

1. A tip having a single-atom termination structure, comprising:
   a thin line member made of a first metal material;
   a protruding portion made of a second metal material, the protruding portion being formed at least in a distal end portion of the thin line member and having a distal end terminated with only one atom; and
   a supply portion made of the second metal material to be supplied to the protruding portion, the supply portion being formed in a vicinity of the distal end portion of the thin line member.

2. A tip having a single-atom termination structure according to claim 1,
   wherein the thin line member includes a rod-like portion and a tapered portion contiguous to the rod-like portion, and
   wherein the supply portion is formed on the rod-like portion of the thin line member.

3. A tip having a single-atom termination structure according to claim 1,
   wherein the first metal material comprises at least any one of tungsten, niobium, tantalum, and molybdenum, and
   wherein the second metal material comprises at least any one of iridium, platinum, osmium, and palladium.

4. A gas field ion source, comprising:
   the tip having a single-atom termination structure of claim 1 as an emitter configured to emit an ion beam;
   an ion source chamber configured to accommodate the emitter;
   a gas supply unit configured to supply gas to be ionized to the ion source chamber;
   an extraction electrode configured to ionize the gas to generate an ion of the gas and apply a voltage for extracting the ion of the gas from the emitter;
   a power source configured to apply a positive voltage and a negative voltage to the tip having a single-atom termination structure; and
   a heating unit configured to heat the tip having a single-atom termination structure.

5. A focused ion beam apparatus, comprising:
   the gas field ion source of claim 4; and
   a control unit configured to form a focused ion beam through use of the ion of the gas generated in the gas field ion source and irradiate a sample with the focused ion beam to perform at least any one of observation, processing, and analysis of an irradiation region of the sample.

6. An electron source, comprising:
   the tip having a single-atom termination structure of claim 1 as a tip configured to emit an electron;
   an extraction electrode configured to generate the electron and apply a voltage for extracting the electron from the tip;
   a power source configured to apply a negative voltage to the tip; and
   a heating unit configured to heat the tip.

7. An electron microscope, comprising:
   the electron source of claim 6; and
   a control unit configured to form an electron beam through use of the electron generated in the electron source and irradiate a sample with the electron beam to perform at least any one of observation and measurement of a minute region of the sample,
   wherein the electron microscope comprises at least any one of a scanning electron microscope, a transmission electron microscope, and a scanning transmission electron microscope.

8. A mask repair apparatus, comprising:
   the gas field ion source of claim 4; and a control unit configured to form a focused ion beam through use of the ion of the gas generated in the gas field ion source and repair a defect portion of a photomask with the focused ion beam.

9. A method of manufacturing the tip having a single-atom termination structure of claim 1, the method comprising single-atom termination treatment of forming the distal end terminated with one atom of the second metal material by heating the thin line member having the supply portion and applying a negative voltage to the thin line member to diffuse the second metal material from the supply portion to the distal end portion of the thin line member.

10. A method of manufacturing the tip having a single-atom termination structure according to claim 9, further comprising:
   cleaning treatment of cleaning the distal end portion of the thin line member;
   heating treatment of heating the distal end portion of the thin line member; and
   supply portion forming treatment of forming the supply portion in the vicinity of the distal end portion of the thin line member,
   the cleaning treatment, the heating treatment, and the supply portion forming treatment being subsequently performed prior to the single-atom termination treatment.

* * * * *